United States Patent
Schrödinger

(10) Patent No.: US 7,245,648 B2
(45) Date of Patent: Jul. 17, 2007

(54) OPTOELECTRONIC ARRANGEMENT

(75) Inventor: Karl Schrödinger, Berlin (DE)

(73) Assignee: Finisar Corporation, Sunnyvale, CA (US)

( * ) Notice: Subject to any disclaimer, the term of this patent is extended or adjusted under 35 U.S.C. 154(b) by 210 days.

(21) Appl. No.: 10/789,647

(22) Filed: Feb. 27, 2004

(65) Prior Publication Data

US 2005/0189473 A1    Sep. 1, 2005

(51) Int. Cl.
*H01S 5/00* (2006.01)

(52) U.S. Cl. .................... 372/50.21; 385/88
(58) Field of Classification Search ............ 250/214.1; 372/43.01, 50.21; 385/88
See application file for complete search history.

(56) References Cited

U.S. PATENT DOCUMENTS

| 5,500,540 A | * | 3/1996 | Jewell et al. ............ 257/82 |
| 5,600,130 A | * | 2/1997 | VanZeghbroeck ........ 250/214.1 |
| 5,907,151 A | * | 5/1999 | Gramann et al. ........ 250/214.1 |
| 5,925,898 A | * | 7/1999 | Spath ..................... 257/98 |
| 6,005,262 A | * | 12/1999 | Cunningham et al. .... 257/84 |
| 6,590,152 B1 | * | 7/2003 | Horio et al. ............ 174/354 |
| 6,922,424 B2 | * | 7/2005 | Weigert et al. .......... 372/43.01 |
| 6,991,381 B2 | * | 1/2006 | Kropp ..................... 385/88 |

FOREIGN PATENT DOCUMENTS

WO    WO 02/084358    10/2002

* cited by examiner

*Primary Examiner*—Minsun Oh Harvey
*Assistant Examiner*—Tuan N. Nguyen
(74) *Attorney, Agent, or Firm*—Workman Nydegger

(57) ABSTRACT

The invention relates to an optoelectronic arrangement having at least one optoelectronic emission component and a monitor component operatively coupled to the emission component to detect at least some radiation radiated by the emission component. A driver circuit of the arrangement is electrically connected to the emission component and the monitor component and a carrier substrate. In this case, the driver circuit is formed as a circuit integrated into the carrier substrate. The monitor component is likewise integrated into the carrier substrate and the emission component is formed as a separate structural part and is arranged on the carrier substrate.

18 Claims, 2 Drawing Sheets

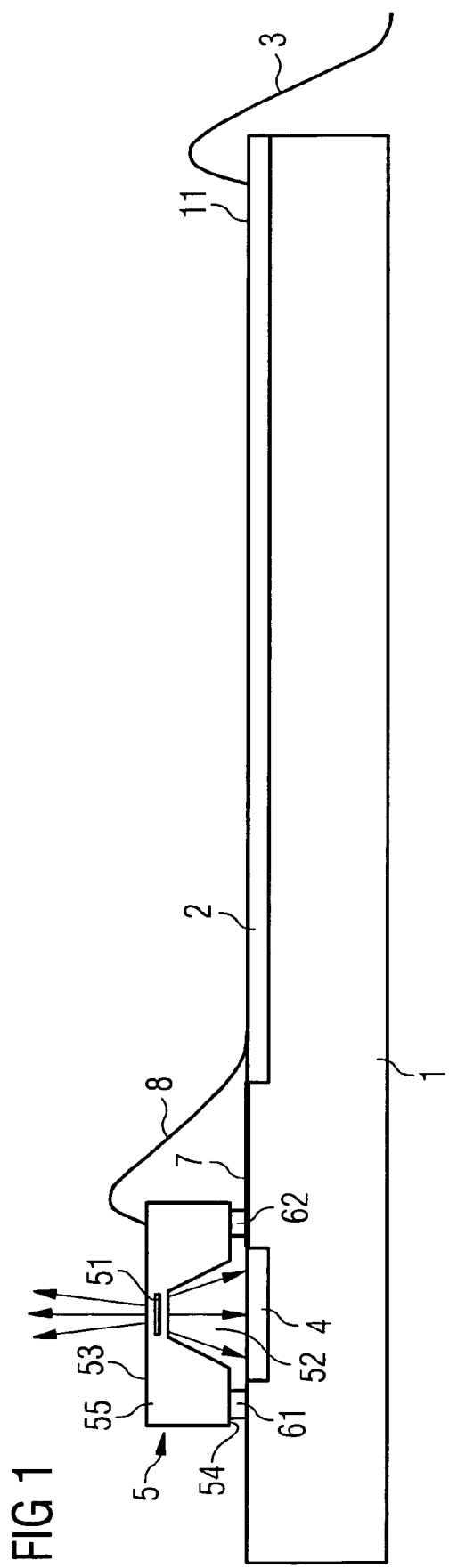

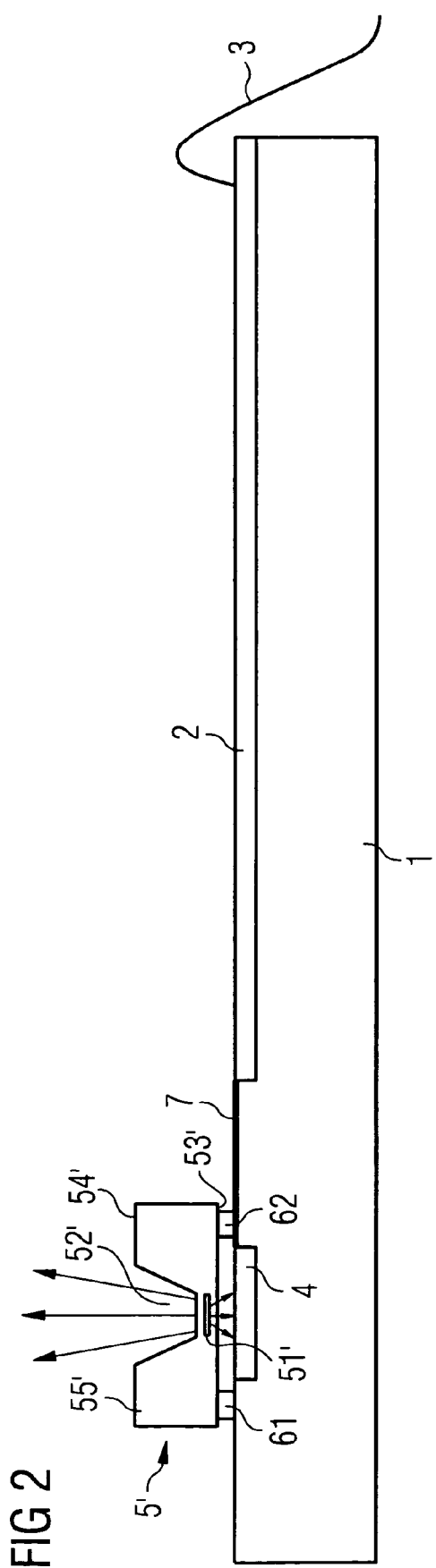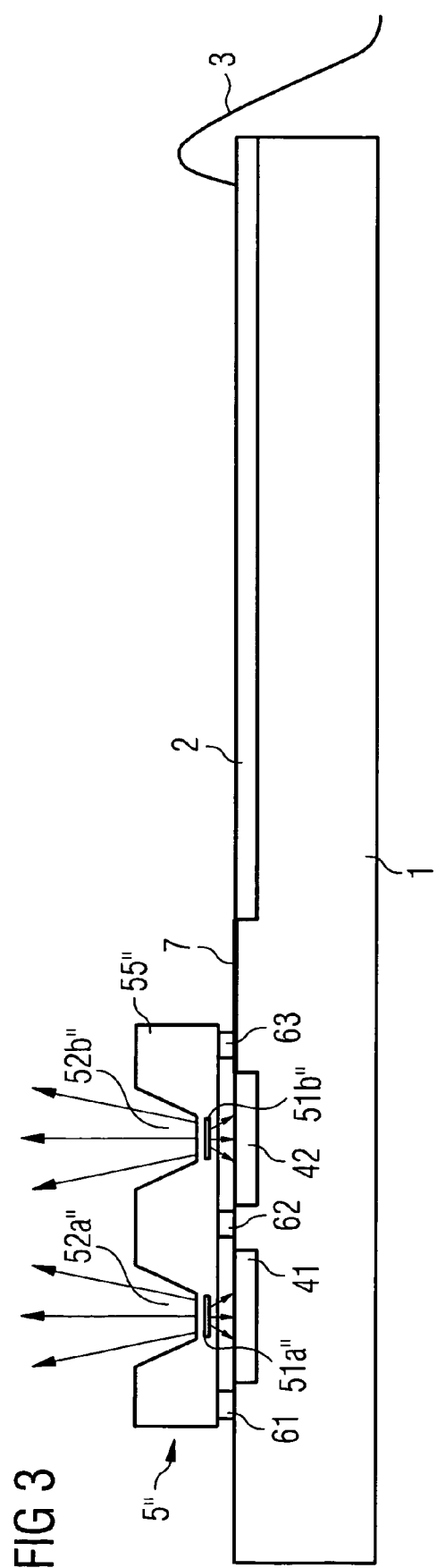

OPTOELECTRONIC ARRANGEMENT

FIELD OF THE INVENTION

The invention relates to an optoelectronic arrangement having an emission component, a monitor component, and a driver circuit. In particular, the invention relates to a compact optoelectronic arrangement for low cost systems with vertically emitting laser diodes which radiate light having a wavelength of between 650 nm and 850 nm.

BACKGROUND OF THE INVENTION

It is known, in optoelectronic arrangements having an emission component, to detect part of the radiation radiated by the emission component by means of a monitor component. The detected signal serves for monitoring the emission power of the emission component. Furthermore, driver circuits are known to which a logical data signal is applied and which generate an analog driver signal for an emission component.

WO 02/084 358 discloses an emission module for an optical signal transmission in which an emission device is arranged on an emission device substrate and a detection device is arranged on a detection device substrate and the emission device substrate and the detection device substrate are arranged one above the other with respect to the direction of the emitted or received light. In this case, the emission device substrate and/or the detection device substrate are transparent to the wavelength emitted by the emission device.

SUMMARY OF THE INVENTION

The present invention is based on the object of providing an optoelectronic arrangement having an emission component, a monitor component and a driver circuit which is distinguished by a compact construction and a small number of parts.

This object is achieved according to the invention by means of an optoelectronic arrangement having: at least one optoelectronic emission component, a monitor component, which is assigned to the emission component and detects part of the radiation radiated by the emission component, a driver circuit electrically connected to the emission component and the monitor component, and a carrier substrate. In this case, the driver circuit is formed as a circuit integrated into the carrier substrate. The monitor component is likewise integrated into the carrier substrate. The emission component is formed as a separate structural part and is arranged on the carrier substrate.

Accordingly, the present invention is distinguished by the concept of integrating the monitor diode of an optoelectronic arrangement into the same substrate in which the driver circuit is formed as an integrated circuit. The emission component is mounted on the substrate with the integrated circuits. The result is an extremely compact arrangement with a complete laser driver. Furthermore, a cost-effective solution is present on account of the small number of parts and the high degree of integration.

The monitor component is preferably formed as a photodiode whose pn junction is integrated into the carrier substrate. The pn junction is realized in the region of the surface of the carrier substrate, so that light emitted by the emission component is detected. The detection signal is fed to the driver circuit via an electrical connection.

In a preferred refinement, the emission component is a vertically emitting laser component (VCSEL) which is fixed directly above the monitor component on the carrier substrate. Part of the laser light is radiated upward and part of the laser light is radiated downward on to the monitor component. In this case, the vertically emitting laser component is preferably formed as a laser chip which is placed on to the carrier substrate.

In order to realize radiation of part of the light of the vertically emitting laser component directly on to the monitor component, one refinement provides for the laser resonator of the laser component to be arranged at that side of the laser component which is remote from the carrier substrate. In this case, the laser substrate has, at the side facing the carrier substrate and in a manner adjoining the laser resonator, a cutout in such a way that the downwardly radiated light falls directly on to the monitor component. In an alternative refinement, the laser resonator is arranged at that side of the laser component which faces the carrier substrate, the laser substrate having, at the side remote from the carrier substrate and in a manner adjoining the laser resonator, a cutout in such a way that light is coupled out upward.

Both embodiment variants are distinguished by a cutout or opening in the substrate of the laser component. The cutout is produced by etching, for example. Depending on whether the laser resonator is arranged at the top side or the underside of the laser component, the cutout is situated at the respective other side. Of course, the formation of a cutout in the substrate is necessary only when the laser substrate is not transparent to the light generated. This is the case with vertically emitting laser components based on GaAs at emitted wavelengths of between 650 nm and 850 nm. If light having a wavelength to which the laser substrate is transparent is generated, there is no need to form cutouts in the laser substrate. This is the case, for example, with vertically emitting laser components based on GaAs at emitted wavelengths of between 900 nm and 1050 nm.

The emission component may be connected to the carrier substrate by adhesive bonding and wire bonding. As an alternative, it is also possible to effect flip-chip mounting on the carrier substrate. In this case, the laser component is arranged with the top side downward on the carrier substrate. Both electrical contacts of the laser component are formed at the top side, i.e. after rotating the laser component at that side of the laser component which faces the carrier substrate. In the case of flip-chip mounting, the soldering connections between the laser component and the carrier substrate provide both a mechanical and an electrical connection between the laser component and the carrier substrate or the driver circuit.

In a preferred refinement, an array of vertically emitting laser components and respectively assigned monitor components are provided, in which case, in the case of each laser component, part of the laser light is radiated upward and part of the laser light is radiated downward on to the associated monitor component. The refinement of the array is for example such that the array of vertically emitting laser components has a common laser substrate and a plurality of laser resonators, the laser resonator in each case being arranged at that side of the laser component which faces the carrier substrate and the laser substrate having, at the side remote from the carrier substrate and in a manner adjoining the laser resonators, a cutout in such a way that light is coupled out upward. Thus, in the case of this refinement, cutouts are again provided in the laser substrate for the transmission of the light that is emitted rearward.

The mounting is preferably effected as flip-chip mounting, it being possible for the entire array to be connected to the carrier substrate in a soldering operation.

The laser components of the array are preferably connected as redundant components, i.e. there is only ever one laser component in operation at a specific point in time. In the event of its failure, another laser component is operated. This embodiment is suitable in particular for low cost systems such as are used in particular in automotive electronics and consumer electronics.

BRIEF DESCRIPTION OF THE DRAWINGS

The invention is explained in more detail below using a plurality of exemplary embodiments with reference to the figures, in which:

FIG. 1 diagrammatically shows, in sectional side view, a first exemplary embodiment of an optoelectronic arrangement with a laser driver, an emission component and a monitor component;

FIG. 2 diagrammatically shows, in sectional side view, a second exemplary embodiment of an optoelectronic arrangement with a laser driver, an emission component and a monitor component; and FIG. 3 diagrammatically shows, in sectional side view, a third exemplary embodiment of an optoelectronic arrangement with a laser driver, an emission component and a monitor component.

DESCRIPTION OF A PLURALITY OF PREFERRED EXEMPLARY EMBODIMENTS

FIG. 1 shows an optoelectronic arrangement having a carrier substrate 1, an emission component 5, a driver circuit 2 for the emission component 5, and a monitor component 4, which detects part of the radiation radiated by the emission component 5.

The driver circuit 2 is formed by an integrated circuit which is integrated monolithically into the carrier substrate 1. In the exemplary embodiment illustrated, the driver circuit 2 is a laser driver to which a logical data signal is applied and which provides an analog driver signal for the emission component 5. In this case, the driver circuit 2 is connected to further electrical circuits via diagrammatically illustrated bonding wires 3 or other electrical lines. Driver circuits for laser modules are known to the person skilled in the art, so that their precise construction is not discussed any further.

The carrier substrate 1 with the integrated driver circuit 2 is formed as a laser driver chip, at one surface 11 of which the driver circuit 2 is integrated.

Furthermore, the monitor component 4 is integrated monolithically into the surface 11 of the carrier substrate 1 or of the laser driver chip. The said monitor component is formed for example by a photodiode with a PN junction. In the PN junction, optical energy is converted into an electrical signal. The PN junction of the photodiode is integrated monolithically into the carrier substrate 1.

Instead of a PN photodiode, it is also possible to use other photodiodes such as, for example, PIN photodiodes, avalanche photodiodes, metal-semiconductor photodiodes and hetero-diodes. All that is essential is that the photodiode is integrated monolithically into the surface of the carrier substrate 1.

The detected wavelength preferably lies in the range between 650 and 850 nm.

In the exemplary embodiment illustrated, the emission component 5 is a vertically emitting laser diode which is placed as a laser diode chip on to the surface 11 of the carrier substrate 1. The laser diode has a substrate 55 and a diagrammatically illustrated vertical resonator 51. The vertical resonator 51 radiates light perpendicularly to the surface of the semiconductor substrate. In this case, the radiation is effected both upward and downward. The radiated light preferably has a wavelength of between 650 and 850 nm. The upwardly radiated light is coupled into a glass or plastic fiber via customary coupling arrangements. The downwardly radiated light falls on to the photodiode 4 and is detected by the latter. The method of operation and the basic construction of vertically emitting laser diodes are known to the person skilled in the art, and so they are not discussed any further.

Vertically emitting laser diodes generally have a GaAs substrate 55. The latter is not transparent to wavelengths of between 650 and 850 nm. In order to ensure that the light radiated downward by the vertical resonator 51 falls on to the photodiode 4, it is therefore necessary to form a cutout 52 in the substrate 55 of the laser diode 5. In the exemplary embodiment of the FIG. 1, the cutout 52 is situated at the side 54 of the laser diode which faces the carrier substrate, and adjoins the vertical resonator 51. The vertical resonator 51 is situated in the region of the side 53 of the laser diode 5 which is remote from the carrier substrate 1.

The laser diode 5 is connected to the surface of the carrier substrate 1 via adhesive bonding connections 61, 62. Electrical contact is made on the one hand via a bonding wire 8, which is bonded from a contact pad (not specifically illustrated) of the driver circuit on to a contact pad (likewise not specifically illustrated) on the top side of the laser diode 5. The radio frequency signal is generally transmitted to the laser diode 5 via the bonding wire 8. As a result of the spatial proximity of the laser diode 5 to the driver circuit 2, the bonding wire 8 can be made very short, so that it represents only a small disturbance even at high frequencies in the Gbit/s range. The ground contact of the laser diode 5 is provided via a diagrammatically illustrated electrical line 7 between the driver circuit 2 and at a soldering contact 62 with the underside of the laser diode 5. Consequently, the soldering contact 62 serves both for an electrical connection and for a mechanical fixing of the laser diode on the carrier substrate 1. Furthermore, the line 7 also represents lines between the monitor diode 4 and the driver circuit 2. The signal detected by the monitor diode 4 is fed to the driver circuit 2.

The construction illustrated in FIG. 1 provides an extremely compact laser driver arrangement. The monitor diode 4 is concomitantly integrated monolithically into the laser driver chip 1 and the VCSEL laser diode 5 is placed above the monitor diode 4 directly on to the laser driver chip 1.

FIG. 2 shows an alternative construction, which differs from the configuration of FIG. 1 in the construction and contact-connection of the laser diode. In the configuration of FIG. 2, the laser diode 5' is mounted by flip-chip mounting on the surface of the carrier substrate 1. In this case, the vertical resonator 51' is formed in the region of the side 53' of the laser diode 5' which faces the carrier substrate 1. Accordingly, the cutout 52' is situated at the side 54' of the laser diode 5' which is remote from the carrier substrate and in a manner adjoining the resonator 51'. The electrical contacts of the laser diode are both arranged on the top side (i.e. after rotation of the laser diode 5' on the side 53' facing the carrier substrate). The flip-chip connection to the carrier substrate 1 is used to effect both an electrical linking of the laser diode 5' to the driver circuit 2 and a mechanical connection between the laser diode 5' and the carrier substrate 1.

An array of vertically emitting laser diodes is provided in the exemplary embodiment of FIG. 3, it being possible for the array to be formed one- or two-dimensionally. In the exemplary embodiment illustrated, two vertical resonators 52a", 52b" are formed in a common laser substrate 55" of the laser diode 5". Accordingly, two photodiodes 41, 42 are integrated in the carrier substrate. The arrangement is effected by flip-chip mounting by means of soldering contacts 61, 62, 63 in accordance with the configuration of FIG. 2. The electrical connection between the driver circuit 2 on the one hand to the photodiodes 41, 42 and on the other hand to the laser diode 5" is effected via diagrammatically illustrated electrical connections 7.

The individual lasers are preferably connected in a redundant manner, i.e. there is only ever one laser that is driven by the driver circuit 2 at a specific point in time. In the event of a failure of the laser, another laser is driven. Such redundant systems are preferably used in low cost systems in the automotive field and in consumer electronics.

The configuration of the invention is not restricted to the exemplary embodiments presented above. By way of example, it is also possible to provide lasers other than vertically emitting lasers, for example edge emitting lasers, a deflection device then additionally being provided for deflecting part of the emitted light on to the monitor diode. The person skilled in the art recognizes that numerous alternative embodiment variants exist which, despite their deviation from the exemplary embodiments described, make use of the teaching defined in the claims hereafter.

The invention claimed is:

1. An optoelectronic arrangement, comprising:
   at least one emission component,
   a monitor component, operatively coupled to the emission component and detecting radiation radiated by the emission component,
   a driver circuit electrically connected to the emission component and the monitor component, and
   a carrier substrate,
   the driver circuit being formed as a circuit integrated into the carrier substrate,
   the monitor component likewise being integrated into the carrier substrate, and
   the emission component being formed as a separate structural part and comprising a vertically emitting laser component which is fixed above the monitor component on the carrier substrate, part of the laser light being radiated upward and part of the laser light being radiated downward on to the monitor component, the laser component comprising a laser resonator and a laser substrate in which:
      the laser resonator is arranged at a side of the laser component which is remote from the carrier substrate, and the laser substrate has, at a side facing the carrier substrate and in a manner adjoining the laser resonator, a cutout in such a way that downwardly radiated light falls on to the monitor component; or
      the laser resonator is arranged at a side of the laser component which faces the carrier substrate, and the laser substrate has, at a side remote from the carrier substrate and in a manner adjoining the laser resonator, a cutout that facilitates radiating light away from the carrier substrate.

2. The arrangement according to claim 1, the monitor component comprising a photodiode having a pn junction integrated into the carrier substrate.

3. The arrangement according to claim 1,
   the laser resonator being arranged at a side of the laser component which is remote from the carrier substrate, and
   the laser substrate having, at a side facing the carrier substrate and in a manner adjoining the laser resonator, a cutout in such a way that downwardly radiated light falls on to the monitor component.

4. The arrangement according to claim 1,
   the laser resonator being arranged at a side of the laser component which faces the carrier substrate, and
   the laser substrate having, at a side remote from the carrier substrate and in a manner adjoining the laser resonator, a cutout that facilitates radiating light away from the carrier substrate.

5. The arrangement according to claim 4, the laser component being arranged with a top side facing toward the carrier substrate and having one or more electrical contacts located at the top side.

6. The arrangement according to claim 1, the emission component being formed as a laser chip.

7. The arrangement according to claim 1, the emission component being connected to the carrier substrate by at least one of adhesive bonding and wire bonding.

8. The arrangement according to claim 1, the emission component being connected to the carrier substrate by flip-chip mounting.

9. The arrangement according to claim 1, further comprising an array of vertically emitting laser components and respectively assigned monitor components, wherein at least some of the laser light is radiated downward onto the associated monitor components.

10. The arrangement according to claim 9,
    the array of vertically emitting laser components having a common laser substrate and respective laser resonators for the laser components,
    the respective laser resonators being arranged at respective sides of the laser components that face the carrier substrate, and
    respective laser substrates for the laser components having, at a side remote from the carrier substrate and in a manner adjoining the laser resonators, respective cutouts that facilitate radiating light away from the carrier substrate.

11. The arrangement according to claim 9, the laser components of the array being connected as redundant components.

12. The arrangement according to claim 1, the carrier substrate being transparent to the radiated light.

13. The arrangement according to claim 1, the emission component emitting light having a wavelength of between 650 and 850 nm.

14. The arrangement according to claim 13, wherein the emission component comprises GaAs.

15. The arrangement according to claim 1, wherein the driver circuit is integrated monolithically into the carrier substrate.

16. The arrangement according to claim 1, wherein the monitor component is integrated monolithically into the carrier substrate.

17. The arrangement according to claim 1, wherein the monitor component comprises a diode.

18. The arrangement according to claim 17, wherein the emission component comprises a laser chip, the diode being integrated monolithically into the carrier substrate and the laser chip being located on the carrier substrate above the diode.

* * * * *